United States Patent [19]

Johansson et al.

[11] Patent Number: 4,811,343

[45] Date of Patent: Mar. 7, 1989

[54] ON-CHIP ON-LINE AC AND DC CLOCK TREE ERROR DETECTION SYSTEM

[75] Inventors: George T. Johansson; Maureen B. Johansson, both of Los Angeles, Calif.

[73] Assignee: International Business Machines Corporation, Armonk, N.Y.

[21] Appl. No.: 20,637

[22] Filed: Mar. 2, 1987

[51] Int. Cl.[4] ............................................. G06F 11/00
[52] U.S. Cl. ........................................ 371/15; 371/61
[58] Field of Search ........................... 371/61, 15, 25; 324/73 R; 307/269; 364/200 MS File, 900 MS File

[56] References Cited

U.S. PATENT DOCUMENTS

| | | | |
|---|---|---|---|
| 3,056,108 | 9/1962 | Heineck | 371/61 |
| 3,328,688 | 6/1967 | Brooks | 324/83 |
| 3,496,477 | 2/1970 | Page | 328/120 |
| 3,521,172 | 7/1970 | Harmon | 328/133 |
| 4,144,448 | 3/1979 | Pisciotta et al. | 235/301 |
| 4,178,554 | 4/1979 | Sase et al. | 328/133 |
| 4,295,220 | 10/1981 | Blum et al. | 371/61 |
| 4,362,957 | 12/1982 | Stern | 307/527 |
| 4,392,226 | 7/1983 | Cook | 371/62 |
| 4,542,509 | 9/1985 | Buchanan et al. | 371/61 |
| 4,564,943 | 1/1986 | Collins et al. | 371/28 |

OTHER PUBLICATIONS

T. Hill, "Variable Frequency Clock Clock", IBM TDB, vol. 1, No. 3, 10/1958, pp. 19-20.
P. James "Anomaly Detection in Overlapping Multiphase Clock", IBM TDB, vol. 22, No. 2, 7/1979, pp. 792-793.

Primary Examiner—Jerry Smith
Assistant Examiner—Robert W. Beausoliel
Attorney, Agent, or Firm—William T. Ellis

[57] ABSTRACT

A test circuit for producing a "fail" signal if a clock path driver circuit develops an AC or DC defect. In the simplest embodiment, this test circuit comprises a time delay block for providing a delayed clock signal and its complement, with a delay that exceeds the signal propagation time through the clock receiver and driver; a latch which, in one embodiment, is clocked by the complement of the delayed clock signal to receive the drive signal and to generate pulses which do not overlap in time with the pulses of the delayed clock signal during normal circuit operation; and a gate for detecting such a pulse overlap and for generating an error signal to indicate an AC or DC fault. This circuit effectively detects AC faults at one edge of the clock pulse and one type of DC fault.

In a further embodiment of the present invention, this circuit can be combined with a complementary circuit to detect AC faults at both edges of the clock pulse.

In a preferred embodiment, the present test circuit is used with a plurality of clock trees on a chip, and all of the error signals from these test circuits are combined to form a single chip error signal.

24 Claims, 3 Drawing Sheets

ON-CHIP ON-LINE AC AND DC CLOCK TREE ERROR DETECTION SYSTEM

BACKGROUND OF INVENTION

The present invention relates generally to the field of computer circuit testing, and more particularly to a circuit for on-line AC and DC fault testing a clock distribution network A standard power-up, fanout tree chip is generally used to distribute clock signals received from an external chip to various locations in a computer. The computer is highly sensitive to the performance of the clock distribution circuits of such a chip, because the addition of unanticipated AC delay during propagation through these circuits will typically result in arrays/latches being clocked late, and the occurrence of DC stuck faults will prevent memory operation.

In particular, experience has shown that significant numbers of small AC defects of less than 5 ns occur in clock distribution chips. Because these clock distribution chips feed more than one field replaceable unit (FRU) at a time, a small AC timing defect will generate errors in more than one Field Replaceable Unit (FRU) computer module at a time. A field engineer attempting to repair such a defect in a computer would thus be required to replace a number of FRU's before discovering the defective clock distribution chip. Moreover, such a defect search would typically require a complete computer shutdown because most circuit diagnostic programs in use require a system shutdown before they can be run.

The invention as claimed is intended to automatically perform both AC and DC fault testing of clock distribution chips while the computer is operating.

The advantage offered by the present invention is that the clock distribution chips in a computer may now be automatically checked on-line. This on-line fault testing includes checks not only for DC stuck faults, but also for AC timing faults. In one embodiment of the present invention, the clock distribution circuit speed can be tested to within a few hundred pico seconds.

SUMMARY OF THE INVENTION

The present invention relates to an on-line, on-chip testing circuit for testing AC and DC faults on chip circuits such as clock distribution chips. The present clock testing circuit comprises:
- a semiconductor chip including means for receiving clock signal pulses from an external source, with each clock pulse having a first and a second edges;
- a clock signal distribution network for distributing the clock signal pulses formed in the chip through various distribution paths with predetermined propagation delays, with the output from these paths being drive signals;
- means on the chip for on-line AC testing the first edge of the clock signal pulses of one of the drive signals against a delayed version of itself for AC errors;
- means on the chip for on-line AC testing the second edge of the clock signal pulses of the one drive signal against a delayed version of itself for AC errors; and
- means on-chip for generating an error signal if an AC fault occurs on either edge of the clock pulses.

In one embodiment of the present invention, the first and second edge on-line AC testing means comprise:
- delay means for delaying the clock pulses by a delay that is greater than the predetermined propagation delay of the one drive signal, to thereby form a first signal and its complement;
- first means for processing the one-drive signal and whichever of the first signal or its complement is closer in phase therewith to form a second signal composed of pulses of one relative logic level and with a width and a phase so that the pulses do not overlap in time with the one relative logic level pulses of the other of the first signal or its complement during normal circuit operation; and
- second means for processing the complement of the one drive signal and the other of the first signal or its complement to form a third signal composed of pulses of one relative logic level and with a width and a phase so that the pulses do not overlap in time with the one relative logic level pulses of the whichever of the first signal or its complement is closest in phase with the one-drive signal.

The first processing means may further comprise first means for detecting the occurrence of an overlap between the pulses of the second signal of the one relative logic level and pulses of the other of the first signal or its complement, and generating a first error signal to indicate a fault on the first edge. The second processing means may comprise:
- second means for detecting the occurrence of the overlap between the pulses of the third signal of one relative logic level and the pulses of the whichever of the first signal or its complement is closest in phase with the one-drive signal, and generating a second error signal to thereby indicate a fault on the second edge. The error signal generating means may comprise means for combining the first and second error signals to form a third error signal for the chip.

In a further embodiment of the present invention, the clock testing circuit may comprise first and a second on-line AC testing means for each drive signal, to thereby cover those signals arriving at different times or at different clock frequencies, or both.

In a further embodiment of the present invention, the circuit may include a pair of error registers, clocked one-half clock pulse apart, for receiving and detecting error signals from the error signal generating means to thereby indicate a malfunction. In yet a further embodiment of the present invention, the circuit may include an on-hold latch for receiving the error signal from the error signal generating means to thereby indicate a malfunction.

DETAILED DESCRIPTION OF THE PREFERRED EMBODIMENT

Figure 1:
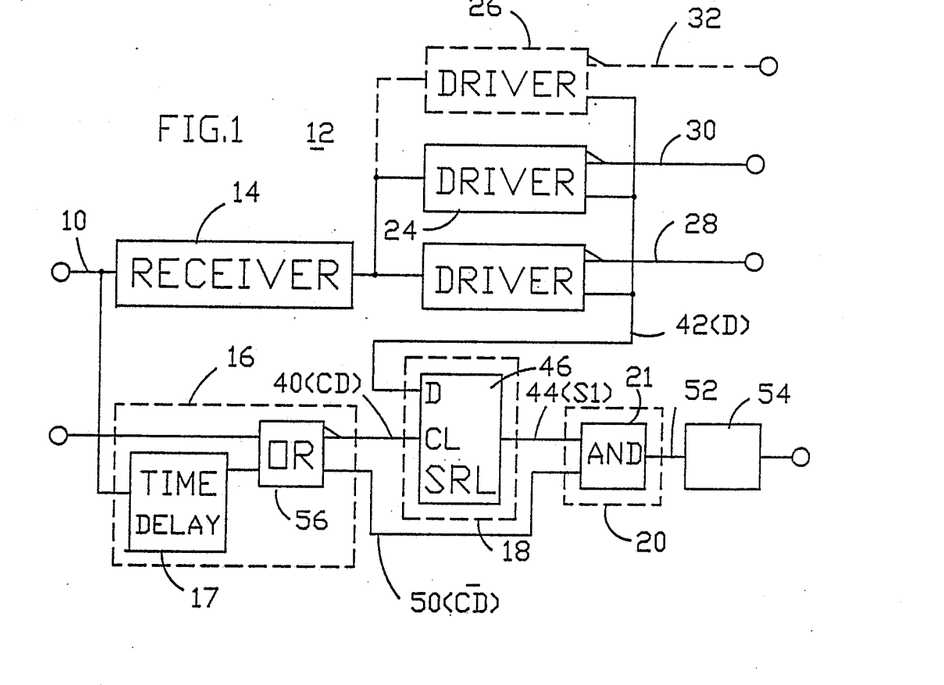
FIG. 1 is a schematic block diagram of one embodiment of the present invention.

Referring now to FIG. 1, there is shown a clock test circuit for detecting DC faults and AC faults, with the AC faults detectable in one embodiment to approximately 200 pico seconds. This testing circuit is operable to check the clock distribution paths for the chip while the chip is operating to perform its intended function. Referring to FIG. 1, there is shown means 10 for obtaining a clock signal; means 12 for receiving and driving the clock signal to provide a drive signal D on line 42; means 16 for delaying the clock signal by a delay that is greater than a predetermined propagation delay through the receiving and driving means 12 to thereby form a first signal, CD and its complement, $\overline{CD}$; first means 18 for processing the drive signal D and whichever of the first signal or its complement is just out of phase or closest in phase with the drive signal to thereby form a second signal S1, on line 44 composed of pulses of one relative logic level and with a width and a phase so that the pulses do not overlap in time with the one relative logic level pulses of the other of the first signal or its complement during normal circuit operation; and first means 20 for detecting the occurrence of an overlap between the pulses of the second signal, S1, of the one relative logic level and pulses of the other of the first signal, CD, or its complement, $\overline{CD}$, and generating a first error signal, E1, on line 52 to thereby indicate a malfunction.

The receiving and driving means 12 is shown in the Figure to include a receiver circuit 14 and a plurality of driver circuits, which in the Figure is illustrated by the three driver circuit blocks 22, 24 and 26. The output line 28, 30 and 32 provide their respective driver clock signals to predetermined clocking locations in the computer.

The present testing circuit is designed to detect either stuck on or stuck off DC faults in the receiver 4, or the drivers 22, 24 and 26, and to check for AC propagation delay faults through any of these circuits blocks. The circuit of the present invention effects this testing by initially comparing the delay of the clock signal propagating through this clock distribution network with a delayed version of this clock signal. In order to effect this comparison, the clock signal, I, from the clock line 10 is also applied to the delaying means 16, which includes a delay element 17. The delay set by this delaying means 16 is made slightly larger than the delay through the receiving and driving means 12, to account for the correlated tolerances of each path. The delaying means 16 generates a delayed version of the clock signal, I, referred to above as the first signal CD, and also generates its complement, $\overline{CD}$.

The first processing means 18 receives the drive signal, D, by means of line 42, and also receives whichever of the first signal, CD, or its complement, $\overline{CD}$, is closest in phase or just out of phase with the drive signal, D, and forms a second signal, S1, on line 44. This second signal, S1, is composed of pulses of one relative logic level and with a width and a phase so that the pulses do not overlap in time with the one relative logic level pulses of the other of the first signal or its complement during normal circuit operation. In the embodiment shown in FIG. 1, the first processing means 18 is implemented by a latch 46 with a data input D and a clock input CL.

First detecting means 20 receives the signal S via line 44 and the other of the first signal or its complement, via line 50, and generates a first error signal, E1, on line 52 to indicate a malfunction when an overlap occurs between the pulses of the second signal, S1, and the pulses of the other of the first signal or its complement. The first detecting means 20 may be implemented by an AND gate 21.

Figure 2:
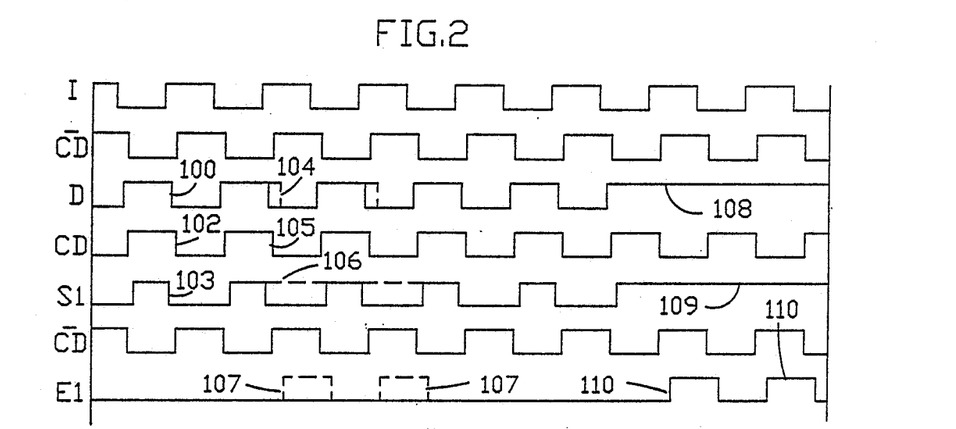
FIG. 2 is a graphical representation of various signals that propagate in the circuit embodiment of FIG. 1

Referring now to FIG. 2, the circuit of FIG. 1 operates as follows. The clock signal I is applied via the line 10 to both the receiving and driving means 12 and to the delaying means 16. After the clock signal, I, has propagated through the receiving and driving means 12, it will have a predetermined propagation delay. This delayed clock signal, D, or its complement, $\overline{D}$, may be then routed to the data input D of the latch 46. In FIG. 2, the drive signal, D, on line 42 is an inverted version of the clock signal I. This inverted pulse signal, D, is represented by the D signal in FIG. 2. The clock signal, I, is also applied through the delaying means 16 in order to provide the first signal, CD, and its complement, $\overline{CD}$. These signals are represented by the CD and $\overline{CD}$ waveforms in FIG. 2. Whichever of this first signal, CD, or its complement, $\overline{CD}$, is closest in phase or just out of phase with the drive signal, D, is applied to the first means 18 for processing. In the particular example of FIG. 2, it can be seen that the first signal, CD, is just out of phase with the signal, D. Accordingly, this first signal, CD, is applied to the clock input CL of the latch 46 for the first processing means 18.

For normal circuit operation, the delay applied by the delaying means 16 is set so that, within specified circuit operation speeds, the falling edge 100 of the drive signal, D, will arrive at the data input D, for the latch 46, just before the falling edge 102 of the first signal, CD, arrives at the clock input CL of the latch 46. Thus, for the positive active latch used in the example of FIG. 1, the first signal, CD, will clock in a second signal level, in this case a "0", just before the CL clock signal, CD, turns off. Thus, the second level, or "0" will be at the latch output on line 44 (S1) due to the falling edge 103 of S1, and thus also at the input to the first detecting means 20. At the same time, the other of the first signal, CD, or its complement, $\overline{CD}$, is applied to the first detecting means 20, which then operates to detect the occurrence of any overlap between the pulses of the signal, S1, from the latch 46, and the pulses of the other of the first signal, CD, or its complement, $\overline{CD}$, and to generate a first error signal, E1, to indicate a malfunction if such an overlap does occur. However, it can be seen that for the initial part of the waveforms the output signal from the latch 46, S1, is low, or at its second level, during the only time when the complement of the first signal, $\overline{CD}$ is high. Accordingly, there is no overlap of the signal, S1, and the signal, $\overline{CD}$, and no error signal is generated. Because of the inherent delay in the latch operation, the latch output signal S1, does not go to its first level, or go high, until after the complement of the first signal, $\overline{CD}$ goes low, or to its second level.

In essence, if the receiving and driving means 12 is operating normally, then the pulses in the signal, S1, generated by the latch 46, which are at one relative logic level, i.e., at a high level, have a width and phase so that they do not overlap in time with the one relative logic level pulses of the complement of the first signal, $\overline{CD}$.

However, if an AC fault does occur, then an error pulse would be generated by the first detecting means 20. By way of example, the dotted portion of the next two cycles of the drive signal D, indicate the presence of an AC delay-adding defect in the clock path circuit for the receiving and driving means 12. In this instance, because the falling edge 104 of the drive signal, D, does not occur until after the falling edge 105 of the first signal, CD, the output, S1, from the latch 46 remains at a high level, 106. Since the output, S1, of the latch 46 is high at the same time as the first signal complement, $\overline{CD}$, the first detecting means 20 generates an error signal pulse 107, in the signal waveform E1. This error signal pulse 107 for the error signal E1, indicates that an overlap has occurred between the, S1, signal from the latch 46 and the complement of the first signal, $\overline{CD}$. Note that the error signal pulse 107 occurs slightly behind, in time, from the complement of the first signal, $\overline{CD}$ because of the propagation delay in block 20. It can be seen that the AC delay tolerance which controls when the first error signal, E1, will be generated, can be controlled simply by controlling the time delay added by the time delay block 16.

The present test circuit will also generate an error signal when a fault in the receiving and driving means 12 causes the output drive signal D to be a "1". Referring to FIG. 2, the signal portion 108 of the signal, D, illustrates the D signal stuck at "1". This signal portion 108 of the drive signal, D, causes the output from the latch 46, S1, to also take a continuous "1" value, as shown by the signal portion 109 of the signal S1. Since there is now an overlap between the S1 signal and the first signal complement, $\overline{CD}$, then each time the $\overline{CD}$ signal goes high, error signal pulses 10 are generated by the first detecting means 20.

The above described first error signal, E1, from the first detecting means 20 may then be applied to a module error reporting register and driver 54. This register 54 is clocked at the proper timing to capture the UP-level of the error signal, E1, to thereby designate an error in the clock chip. Typically, this reporting register 54 is clocked from another module in order to insure that it is clocked through a different clock distribution network than the one that is being tested. In order to make this reporting register 54 independent of the clock timing, this register 54 may be implemented by a pair of registers, which are clocked a half cycle apart. Such a configuration allows design freedom to make timing changes, i.e., there is no chip EC sensitivity to timing changes. An alternate method for making this reporting register 54 independent of clock timing is to implement it with an ON-hold latch. It should be noted that the reporting register noted above may be located on another chip. The block 54 in FIG. 1 would then simply comprise a driver circuit.

The time delaying means 16 is shown to include an OR gate 56. This OR gate 56 is utilized to permit the application of a test latch clock control input signal to turn off the CL clock signal to the latch 46. This CL clock turn-off ability makes this circuit LSSD compatible.

Figure 3:
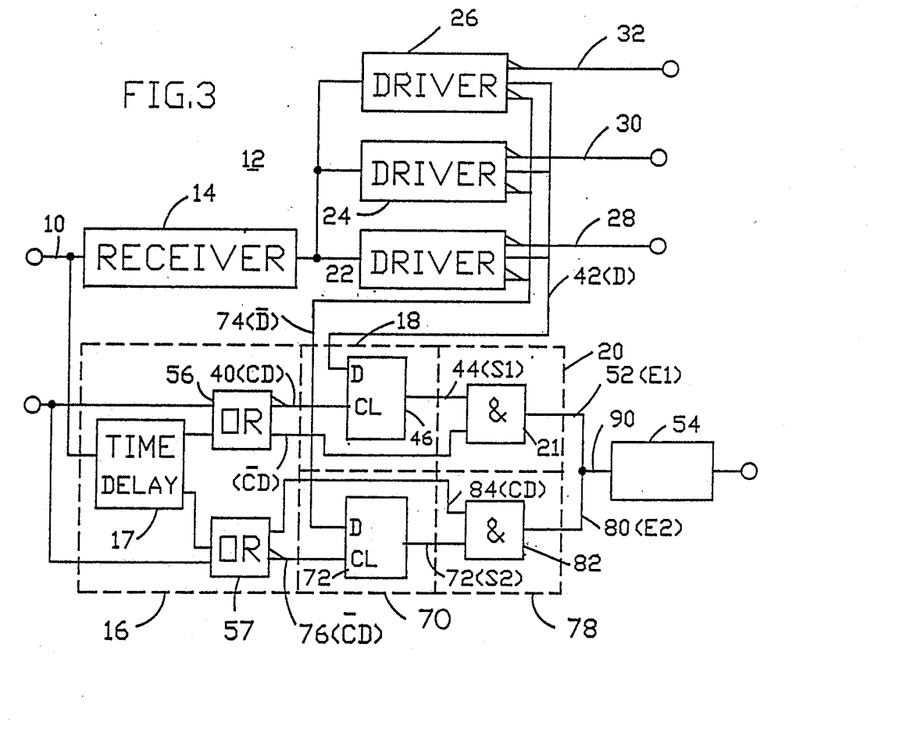
FIG. 3 is a schematic block diagram of a further embodiment of the present invention.

It can be seen that the circuit described in FIG. 1 tests for DC faults where the D drive signal is stuck at "1", and tests for AC faults that occur on the falling edge 100 of the D drive signal. A circuit complementary to the test circuit of FIG. 1 may be utilized to test for DC faults where the D signal is stuck at "0" and to test for AC faults that occur on the rising edge of the D drive signal. FIG. 3 shows a circuit of a type shown in FIG. 1 in combination with a complementary testing circuit, which combination is capable of detecting any DC fault, and AC faults on either the rising or the falling edge of the D drive signal.

Referring now to FIG. 3, the means 10 for obtaining a clock signal for application to a receiving and driving means 12 is again shown. The receiving and driving means 12 again includes a receiver 14 and a plurality of drivers 22, 24, and 26 for generating the respective output signals 28, 30 and 32. The test circuit includes the time delay block 16 with a time delay element 17 for generating a time delayed clock signal and its complement. The time delay block 16 also includes two OR gates 56 and 57. The circuit for testing the falling edge of the drive signal, D, again includes the first processing means 18, which is implemented by the latch 46, and the first detecting means 20, which is implemented by an AND gate 21. This AC falling edge testing circuit, including the first processing means 18 and the first detecting means 20, operates in the same manner described previously for FIG. 1, and generates the same wave forms as shown in FIG. 2.

The complementary circuit for testing for AC faults on the rising edge of the pulse D, and for DC faults where the D signal is stuck at "0", includes a second processing means 70 for processing the complement, $\overline{D}$, of the drive signal from the receiving and driving means 12 and the other ($\overline{CD}$) of the first signal or its complement to form a third signal, S2, on line 72. This third signal, S2, has a width and a phase so that it does not overlap in time with the one relative logic level pulses (high) of the whichever of the first signal or its complement is closest in phase with the drive signal during normal circuit operation. Again, the second processing means 70 is implemented by a latch 72. The complement, $\overline{D}$, of the drive signal is applied to the data input of the latch 72 via the line 74, and the latch 72 is clocked by the signal, $\overline{CD}$, on the line 76 (the other of the first signal or its complement).

This complementary circuit also includes a second detecting means 78, which may be implemented by an AND gate 82. The S2 signal from the latch 72 is applied as one input to the AND gate, while the signal, CD, is applied as the second input.

Figure 4:
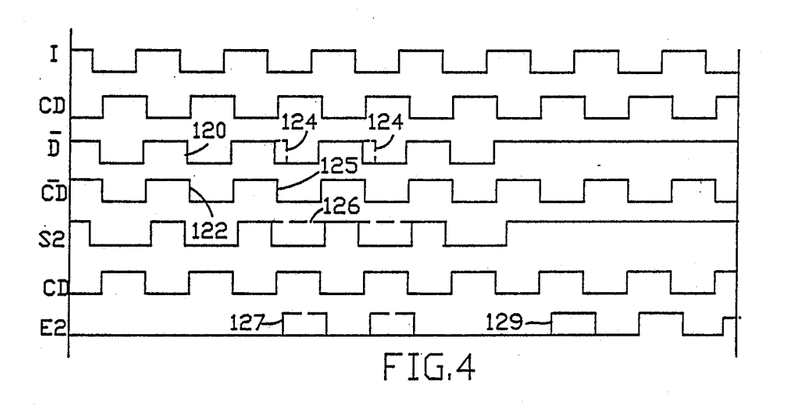
FIG. 4 is a graphical representation of various signals which propagate in the circuit of FIG. 3.

The above-described signals are shown in the signal timing diagram of FIG. 4. Again, the delayed clock signal complement, $\overline{CD}$, always has its first edge 122 follow in time the first edge 120 of the complement of the drive signal, $\overline{D}$, during normal circuit operation. Accordingly, output signal, S2, from the latch 72 generates a signal at the second level ("0"), during all of the time that the first signal complement, $\overline{CD}$, is high. The circuit further includes second means 78 for detecting the occurrence of an overlap between the one relative logic level pulses ("1") of whichever of the first signal or its complement is just out of phase with the drive signal "D", and the output signal S2 from the latch 72. If an overlap does occur, then this second detecting means 78 generates a second error signal, E2, on the line 80 to thereby indicate a circuit malfunction.

Again, the dotted line falling edges 124 for the complement, $\overline{D}$, of the drive signal indicate an AC delay fault. This AC delay fault on the falling edge 124 of the signal, $\overline{D}$, causes this falling edge 124 to arrive at the data input D of the latch 72 after the falling edge 125 of the first signal complement, $\overline{DC}$. The result of this AC fault on $\overline{D}$ is that the output signal, S2, on line 72 remains high during the time that clock signal, $\overline{CD}$, is high. This high output signal, represented by the signal 126, is applied to the AND gate 82 along with the first signal, CD, on the line 84. Since both the S2 and CD signals overlap at the one relative logic level ("1"), the AND gate 82 generates an error pulse 127 for signal E2 on its output line 80.

Likewise, if a DC fault occurs in the receiving and driving means 12 to cause the $\overline{D}$ signal to remain high, this will result in the output signal, S2, of the latch 72 also going high. Accordingly, the AND gate 82 of the second detecting means 78 will detect the occurrence of an overlap between the signal, S2, and the signal, CD and will generate second error signal pulses 129 on the line 80 to thereby indicate a malfunction.

The first and second error signals on the lines 52 and 80, respectively, may, in one embodiment, be combined to form a single third error signal on line 90. This signal combining function may be conveniently accomplished simply by means of a dot OR connection.

Figure 5:
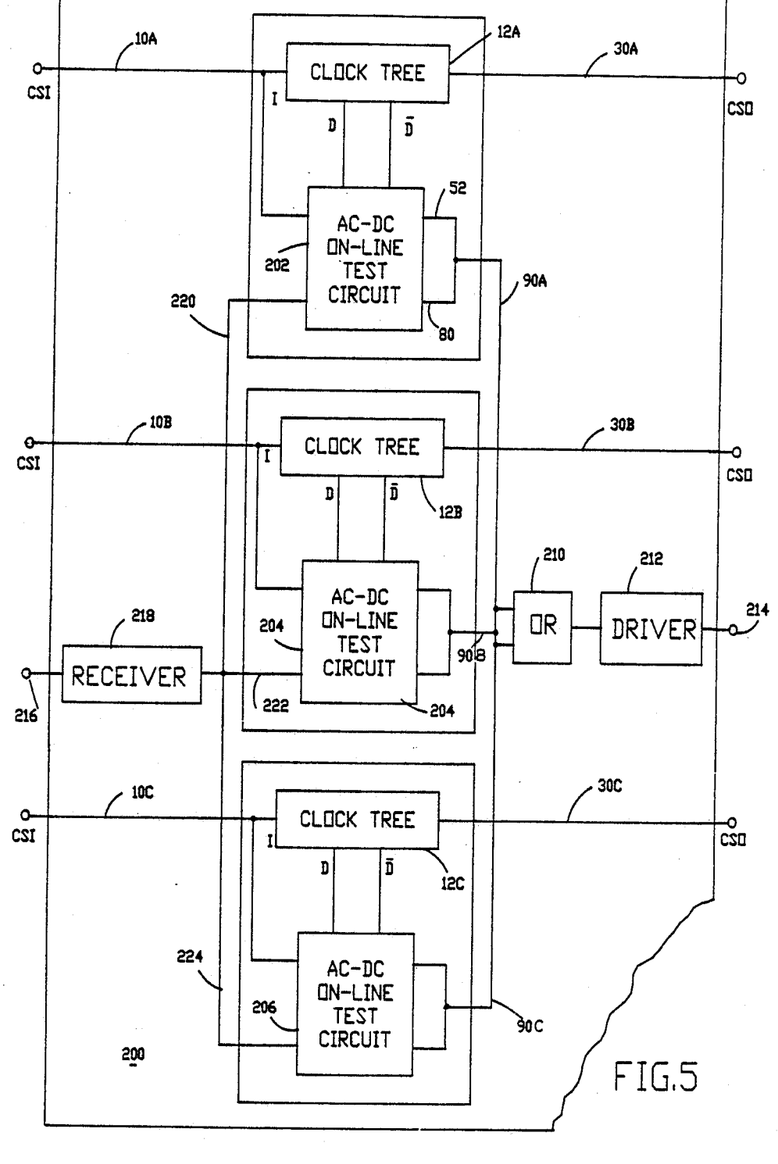
FIG. 5 is a schematic block diagram of the circuit of the present invention in the context of a clock distribution chip.

The circuit of the present invention is especially advantageous for use with clock distribution chips of the type shown in FIG. 5. A clock distribution chip operates to receive a plurality of different clock signals (signals with different frequencies or different arrival times, or both) and to distribute those clock signals by means of clock powering trees to a large number of other chips in the computer. Referring to FIG. 5, the clock distribution chip 200 receives a plurality of different clock frequency signals on lines 10A, 10B and 10C. Each of these different clock signal lines 10A, 10B and 10C, has its own clock tree 12A, 12B and 12C, respectively. These clock trees distribute their clock output signals via the lines 30A, 30B and 30C to respective clock signal output terminals, CS0, on the chip. An AC-DC on-line test circuit may be implemented for each clock tree 12A, 12B and 12C. This test circuit may simply include a circuit of the type shown in FIG. 1 for testing for AC faults on one edge of the clock signal pulses and for one DC fault, or it may be implemented with a circuit of the type shown in FIG. 3 for testing for AC faults on both edges of the clock signal and for both types of DC faults. In the circuit of FIG. 5, the AC-DC on-line test circuits 202, 204 and 206 are implemented with a circuit of the type shown in FIG. 3. Accordingly, both a drive signal, D, and the drive signal complement, $\overline{D}$, are applied as inputs to the test circuits. Each test circuit 202, 204 and 206, generates the first and second error signals, E1 and E2, on the lines 52 and 80, respectively. These first and second error signals E1 and E2, for each test circuit are then combined by a dot OR function and the third error signal is formed on line 90. By way of example, each of these third error signals 90A, 90B and 90C, may then be applied to an OR gate 210. The output signal from this OR gate 210 may then be applied by means of a driver block 212 to a chip clock error signal terminal 214 on the chip. This clock distribution chip 200 may be made LSSD compatible by including means for applying the aforementioned test latch clock control input to each of the test circuits 202, 204 and 206. In the clock distribution chip of FIG. 5, this signal is applied by means of the input terminal 216, the receiver 218, and the respective receiver output lines 220, 222 and 224, which apply the signal to the test circuits 202, 204 and 206.

It should be noted that the concepts of the present invention can be implemented in a wide variety of different configurations. Although the present invention has been illustrated with latches which utilize positive active clocks (the value of the clock which operates or opens the latch to allow data to be received), these circuits can easily be modified to operate with negative active clocks, simply by changing the signal utilized to clock the particular latch to its complement.

The present invention has disclosed a circuit which checks the performance of clock distribution chips on-line, i.e., the circuit monitors the clock distribution chips while the computer is operating, so that an error is detected when it first appears in the clock distribution chip.

Additionally, the present invention operates to check the speed of the individual clock trees, i.e., the AC performance of the clock distribution chip. This speed check is essential because these clock distribution chips are the most timing-critical chips in a computer, since they control the entire timing of the computer system.

It should be further noted that with the present test circuit the speed of the clock signal distribution paths can now be tested with an oscillator clock input signal which is far slower than the distribution circuits actually being tested. This feature is important because it permits this test circuit to be used in chip level testing, before the clock distribution chips are mounted on the computer module. Additionally, the present inventive test circuit permits the detection of AC timing defects which are much smaller than the 5 ns minimum which current day testers are able to detect. Because such clock distribution chips have a high system sensitivity to such small AC defects, this added AC testing capability will save significant time and money in module testing and system testing areas.

It should also be noted that the present inventive circuit operates independently of the clock signal frequency. This clock independency allows the reduction of the cycle time of the computer and allows the computer to run with a variable frequency oscillator without creating false fail signals.

It should be again reiterated that the present test circuit may be implemented using either a FIG. 1-type-configuration or a FIG. 3-type-configuration. The FIG. 1-type-configuration is useful for testing one edge of a clock pulse for AC faults and for testing for one type of stuck DC fault. This type of circuit may be useful in applications where power or silicon is limited or where there is only one critical edge.

The present test circuits features provide several distinct advantages over current test circuits and systems. The present test circuit has the ability to test the speed of clock distribution circuits to within a few hundred pico seconds, compared to the approximately 5 ns of present clock test systems. One of the factors which makes this high-speed clock distribution circuit testing possible is the fact that the timing-critical part of the test circuit is on the chip under test, where it can match the chip's performance as well as be correlated to the tolerance of the clock distribution path under test. In this regard, it should be noted that clock tester speeds and the various tolerances involved with these testers and their circuits are the main reasons why clock test systems historically have not been able to accurately AC test high performance logic chips. The tolerances involved with signal propagation through external cables, and C4 connections are completely eliminated with the present configuration.

It should be noted that in cases where one or more clock powering trees on a clock distribution chip are not to be used, then the test circuits for those clock trees may have their test circuit latches set to zero at initialization and the clock signal input to the latches tied to zero. These connections insure that the values in the latches remain at zero, to thereby prevent false error signals from being generated by the test circuit.

It should further be noted that it may be desirable to make the circuitry of the present test circuit testable in its own right. This test circuit may be rendered 100% testable by the use of one control point and one listening point in a circuit. By way of example, the one control point may be simply implemented by adding an OR gate to the line 42 for the D signal and the line 44 for the $\overline{D}$ signal. An appropriate control signal may then be applied through these OR gates to the respective latches in the circuit. The one listening point may be implemented simply by monitoring the output recording register 54.

Finally, it should be noted that although the present circuit was described in the context of clock distribution chip testing, it may be utilized to test a variety of other signal pulse trains, which may be characterized as clock signals for purposes of this circuit.

While the present invention has been particularly shown and described with reference to preferred embodiments therefor, it will be understood by those skilled in the art that the foregoing and other changes in form and detail may be made therein without departing from the spirit and the scope of the present invention, as defined in the appended claims.

We claim:

1. A testing circuit comprising:
    means for obtaining a clock signal;
    means for receiving and driving said clock signal to provide a drive signal;
    means for delaying said clock signal by a delay that is greater than a predetermined propagation delay through said receiving and driving means to form a first signal and its complement;
    first means for processing said drive signal and whichever of said first signal or its complement is just out of phase with said drive signal to form a second signal composed of pulses of one relative logic level and with a phase and reduced width compared to said drive signal pulses so that said pulses do not overlap in time with said one relative logic level pulses of the other of said first signal or its complement during normal circuit operation; and
    first means for detecting the occurrence of an overlap between said pulses of said second signal of said one relative logic level and pulses of the other of said first signal or its complement, and generating a first error signal to thereby indicate a malfunction.

2. A circuit as defined in claim 1, further comprising second means for processing the complement of said drive signal from said receiving and driving means and the other of said first signal or its complement to form a third signal composed of pulses of a one relative logic level with a width and phase so that they do not overlap in time with said one relative logic level pulses of said whichever of said first signal or its complement is just out of phase with said drive signal during normal circuit operation; and
    second means for detecting the occurrence of an overlap between said one relative logic level pulses of said whichever of said first signal or its complement is just out of phase with said drive signal and said third signal pulses of said one relative logic level, and generating a second error signal to thereby indicate a malfunction.

3. A testing circuit as defined in claim 2, comprising means for combining said first and second error signals from said first and second detecting means, respectively, to form a third error signal.

4. A testing circuit as defined in claim 2, wherein there are a plurality of clock trees means on a chip, wherein each of said clock trees means includes said means for obtaining a clock signal, said receiving and driving means, said delaying means, said processing means, and said detecting means, and operate to generate said first and second error signals; and
    means for combining said error signals from each of said plurality of error detection circuits to form a single error detection signal for said chip.

5. A testing circuit as defined in claim 1, wherein there are a plurality of clock trees means on a chip, wherein each of said clock trees means includes said means for obtaining a clock signal, said receiving and driving means, said delaying means, said processing means, and said detecting means, and operate to generate said first error signal; and
    means for combining said error signal from each of said plurality of error detection circuits to form a single error detection signal for said chip.

6. A testing circuit as defined in claim 1, wherein said processing means comprises:
    a latch that has its data input connected to receive said drive signal from said receiving and driving means, and is clocked by said whichever signal.

7. A testing circuit as defined in claim 6, wherein said delaying means includes a delay element for delaying said clock signal, and a gate with inputs from said delay element and from an external test latch clock control, for generating a first signal output and a complement output.

8. A testing circuit as defined in claim 1, wherein said first detecting means comprises an AND gate.

9. A testing circuit as defined in claim 1, further comprising a pair of error registers, clocked one-half clock pulse apart, for receiving said error signal from said first detecting means to thereby indicate a malfunction.

10. A testing circuit as defined in claim 1, further comprising an on-hold latch for receiving said error signal from said first detecting means to thereby indicate a malfunction.

11. An on-line, on-chip AC and DC clock path error detection circuit for detecting a failure in any clock tree on a chip, with each clock tree comprising a receiver and a plurality of driver circuits for receiving a clock signal and providing a plurality of drive signals, comprising:
    a plurality of error detection circuits on a chip, one for each clock tree, with each error detection circuit including:
        means for obtaining a clock signal;
        means for delaying said clock signal by a delay that is greater than a predetermined propagation delay through said receiving and driving means to form a first signal and its complement;
        first means for processing said drive signal and whichever of said first signal or its complement is closest in phase to said drive signal to form a second signal composed of pulses of one relative logic level and with a width and phase so that said pulses do not overlap in time with said one relative logic level pulses of the other of said first signal or its complement during normal circuit operation; and first means for detecting the occurrence of an overlap between said pulses of said second signal of said one relative logic level and pulses of the other of said first signal or its complement, and generating a first error signal to thereby indicate a malfunction; and means for combining said first error signal from each of said plurality of error detection circuits to form a single error detection signal for said chip.

12. An on-chip clock tree error detection circuit as defined in claim 11, wherein each of said error detection circuits further comprises:

second means for processing the complement of said drive signal from said receiving and driving means and the other of said first signal or its complement to form a third signal composed of pulses of a one relative logic level with a width and phase so that they do not overlap in time with said one relative logic level pulses of said whichever of said first signal or its complement is closest in phase with said drive signal during normal circuit operation;

second means for detecting the occurrence of an overlap between said one relative logic level pulses of said whichever of said first signal or its complement is just out of phase with said drive signal, and said third signal pulses of said one relative logic level, and generating a second error signal to thereby indicate a malfunction; and wherein said combining means includes means for combining said first error signals with said second error signals to form said single error detection signal for said chip.

13. An on-chip clock tree error detection circuit as defined in claim 12, wherein said first and second processing means comprise first and second latches, with each of said latches having a data input for receiving one of said drive signals or its complement, and with each of said latches being clocked by one of said first signal or its complement.

14. An on-chip clock tree error detection circuit as defined in claim 13, further comprising an on-hold latch for receiving the error signal from said combining means to thereby indicate a malfunction.

15. An on-chip clock tree error detection circuit as defined in claim 12, further comprising a pair of error registers, clocked one-half clock pulse apart for receiving the error signal from said combining means to thereby indicate a malfunction.

16. A testing circuit comprising:

means for obtaining a clock signal, said clock signal having a first edge to change the signal from a first level to a second level;

means for receiving and driving said clock signal to yield a drive signal with said first edge;

means for delaying and processing said clock signal to provide a delayed clock signal and its complement, wherein said delay is greater than any propagation delay through said receiving and driving means, so that said delayed first edge from one of said delayed clock signal or its complement follows in time said drive signal first edge during normal signal operation;

first means for generating a second signal with a signal level comparable to said second level each time said delayed first edge of whichever of said delayed clock signal or its complement is just out of phase with said drive signal and follows in time said drive signal first edge, with said second level existing for a time period that is greater than one-half the period of said clock signal; and means for comparing the level of said second signal and the level of the other of said delayed clock signal or its complement, and for generating a first predetermined signal during the period when said levels are comparable to said first level to thereby indicate a malfunction.

17. A testing circuit as defined in claim 16, further comprising:

second means for generating a third signal with a signal level comparable to said second level each time said delayed first edge of the other of said delayed clock signal or its complement follows in time the first edge of the complement of said drive signal during normal circuit operation;

second means for comparing the level of said third signal and the level of said whichever of said first signal or its complement is just out of phase with said drive signal, and generating a second predetermined signal during the period when said levels are comparable to said first level to thereby indicate a malfunction; and means for combining said first and second predetermined signals to form a third error signal.

18. A testing circuit as defined in claim 17, further comprising a pair of error registers, clocked one-half clock pulse apart, for receiving said third error signal and detecting a malfunction.

19. A testing circuit as defined in claim 17, further comprising an on-hold latch for receiving said third error signal and detecting a malfunction.

20. An on-line, on-chip clock testing circuit, comprising:

a semiconductor chip including means for receiving clock signal pulses from an external source, with each clock pulse having a first and a second edges;

a clock signal distribution network for distributing said clock signal pulses formed in said chip through various distribution paths with predetermined propagation delays, with the outputs from these paths being drive signals;

means on said chip for on-line AC testing said first edge of said clock signal pulses of one of said drive signals against a delayed version of itself for AC errors;

means on said chip for on-line AC testing said second edge of said clock signal pulses of said one drive signal against a delayed version of itself for AC errors; and means on-chip for generating an error signal if an AC fault occurs on either edge of said clock pulses.

21. An on-chip clock testing circuit as defined in claim 20, wherein said first and second edge on-line AC testing means comprise:

delay means for delaying said clock pulses by a delay that is greater than the predetermined propagation delay of said one drive signal, to thereby form a first signal and its complement;

first means for processing said one drive signal and whichever of said first signal or its complement is closer in phase therewith to form a second signal composed of pulses of one relative logic level and with a width and a phase so that said pulses do not overlap in time with said one relative logic level pulses of the other of said first signal or its complement during normal circuit operation; and second means for processing the complement of said one drive signal and the other of said first signal or its complement to form a third signal composed of pulses of one relative logic level, and with a width and a phase so that said pulses do not overlap in time with said one relative logic level pulses of said whichever of said first signal or its complement is closest in phase with said one drive signal during normal circuit operation.

22. An on-chip clock testing circuit as defined in claim 21, wherein said first processing means comprises:

first means for detecting the occurrence of an overlap between said pulses of said second signal of said one relative logic level and pulses of the other of said first signal or its complement, and generating a first error signal to indicate a fault on said first edge; and wherein said second processing comprises:

second means for detecting the occurrence of an overlap between said pulses of said third signal of said one relative logic level and pulses of said whichever of said first signal or its complement is closest in phase with said one drive signal, and generating a second error signal to thereby indicate a fault on said second edge.

23. An on-chip clock testing circuit as defined in claim 22, wherein said error signal generating means comprises:

means for combining said first and second error signals to form a third error signal.

24. An on-chip clock testing circuit as defined in claim 22, wherein said clock testing circuit comprises first and second on-line AC testing means for a plurality of drive signals having different propagation delays on said chip.

* * * * *